United States Patent
Creasey et al.

(10) Patent No.: US 7,075,576 B2
(45) Date of Patent: Jul. 11, 2006

(54) CCD CAMERA HAVING AN ANTI-STOKES PHOSPHOR BOUND THERETO

(75) Inventors: Jonathan Creasey, Essex (GB); John De Mattos, Hertfordshire (GB); Glenn Tyrrell, Middlesex (GB)

(73) Assignee: Applied Scintillation Technologies, Ltd., Harlow (GB)

( * ) Notice: Subject to any disclaimer, the term of this patent is extended or adjusted under 35 U.S.C. 154(b) by 693 days.

(21) Appl. No.: 09/851,536

(22) Filed: May 8, 2001

(65) Prior Publication Data

US 2002/0044781 A1    Apr. 18, 2002

(30) Foreign Application Priority Data

Oct. 13, 2000    (EP) .................................. 00309030

(51) Int. Cl.
*H04N 3/14*    (2006.01)
*H04N 5/335*   (2006.01)
*H04N 5/33*    (2006.01)
*H01L 25/00*   (2006.01)

(52) U.S. Cl. ..................... 348/311; 348/164; 250/332

(58) Field of Classification Search ................ 250/581, 250/330, 332, 483.1, 484.2, 484.3, 484.4, 250/475.1, 582, 583; 348/164, 294, 311; 438/57, 60, 73, 75
See application file for complete search history.

(56) References Cited

U.S. PATENT DOCUMENTS

| | | | |
|---|---|---|---|
| 4,149,989 A * | 4/1979 | Kashiwada et al. ... | 252/301.4 P |
| 4,646,140 A | 2/1987 | Bailey et al. .................. | 358/50 |
| 5,121,214 A | 6/1992 | Turko et al. ............ | 358/213.19 |
| 5,365,092 A * | 11/1994 | Janesick ...................... | 257/232 |
| 5,376,810 A * | 12/1994 | Hoenk et al. ................ | 257/228 |
| 5,541,012 A * | 7/1996 | Ohwaki et al. .............. | 428/690 |
| 5,753,921 A | 5/1998 | Trauernicht et al. ... | 250/370.09 |
| 5,820,265 A * | 10/1998 | Kleinerman ................. | 374/137 |
| 5,990,506 A * | 11/1999 | Fossum et al. ............. | 257/294 |
| 6,081,577 A * | 6/2000 | Webber ........................ | 378/23 |
| 6,211,524 B1 * | 4/2001 | Vardeny et al. .......... | 250/458.1 |
| 6,254,806 B1 * | 7/2001 | Valdna et al. ......... | 252/301.6 R |
| 6,369,402 B1 * | 4/2002 | Gebele et al. .............. | 250/585 |
| 6,597,398 B1 * | 7/2003 | Booth, Jr. .................... | 348/272 |

FOREIGN PATENT DOCUMENTS

| | | |
|---|---|---|
| EP | 0772059 A1 | 5/1997 |
| EP | 0972816 A2 | 1/2000 |
| GB | 2214382 A * | 8/1989 |

OTHER PUBLICATIONS

Spiricon Optical Telecom Analysis, 1550 nm Telecom NIR Cameras, May 2003, Spiricon, Inc.*
Morrisey et al., Vacuum-ultraviolet Quantum Efficiency of a Phosphor-coated Charge-coupled device May 1, 1994, Applied Optics, vol. 33, No. 13, pp. 2534-2538.*

* cited by examiner

*Primary Examiner*—Tuan Ho
*Assistant Examiner*—Justin Misleh
(74) *Attorney, Agent, or Firm*—Edell, Shapiro & Finnan, LLC

(57) ABSTRACT

A camera includes a charge-coupled device (CCD). The CCD has an anti-stokes phosphor bound to the light receiving surface of the CCD. The anti-stokes phosphor emits electromagnetic radiation having wavelengths in the range of 950 nm to 1100 nm. A housing surrounds the CCD and defines a filtered aperture through which, in use, light can pass and be received by the phosphor CCD.

7 Claims, 2 Drawing Sheets

CCD CAMERA HAVING AN ANTI-STOKES PHOSPHOR BOUND THERETO

CROSS-REFERENCE TO RELATED APPLICATIONS

This application claims priority under 35 U.S.C. § 119 to European application number 00309030.5, filed on Oct. 13, 2000.

BACKGROUND OF THE INVENTION

1. Field of the Invention

This invention relates generally to a camera employing a charged coupled device (CCD).

2. Background of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Many such cameras are available, however, very few are sensitive to particular wavelengths. For example, there is a need to provide a camera for use in the design and manufacture of optical communications high wavelength infrared systems, but very few cameras which are sensitive to the wavelengths at which such systems work are presently available. The cameras that are available are usually bulky and expensive, making their application in many environments at best impractical, and at worst impossible.

The present invention may be directed to one or more of the problems set forth above.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

There is a need to provide a camera that is inexpensive and small, yet which is sensitive to particular infrared wavelength ranges.

In accordance with one aspect of the present invention, there is provided a camera comprising:

a charge-coupled device (CCD), the CCD having an antistokes phosphor bound to the light receiving surface thereof; and a housing surrounding the CCD and defining an aperture through which, in use, light can pass and be received by the phosphor CCD.

BRIEF DESCRIPTION OF THE DRAWINGS

The foregoing and other advantages of the invention will become apparent upon reading the following detailed description and upon reference to the drawings in which.

DESCRIPTION OF THE SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

The term "anti-stokes" refers to an emission process which does not conform to Stoke's second law that a material's fluorescence emission is lower in photon energy than the absorbed photon energy. many instances of such effects have been observed in many material systems, but perhaps the most efficient of these are from pairs of non-identical triply ionized rare earth ions, e.g. $Er^{3+}$, $Yb^{3+}$ doped into a crystalline host.

The anti-stokes phosphor may be sensitive to light in the wavelength range of 1500 to 1610 nm and preferably emits in the range of 950 nm to 1075 nm. Anti-stokes phosphors of this type have high efficiency, and they can be married to relatively inexpensive CCD's which are sensitive to the aforementioned emitting wavelength range.

The camera may comprise one or more filters positioned between the aperture and the phosphor coating on the CCD in order to reject ambient light to which the CCD is normally sensitive. The phosphor may be $Y_2O_2S{:}ErYb$, $YF_3{:}ErYb$, $NaYF_4{:}ErYb$, $La_2O_2S{:}ErYb$, or a related up conversion matrix for example. The phosphor may be bound to the CCD by an adhesive such as an isobutyl/butyl acrylic copolymer.

Figure 1:
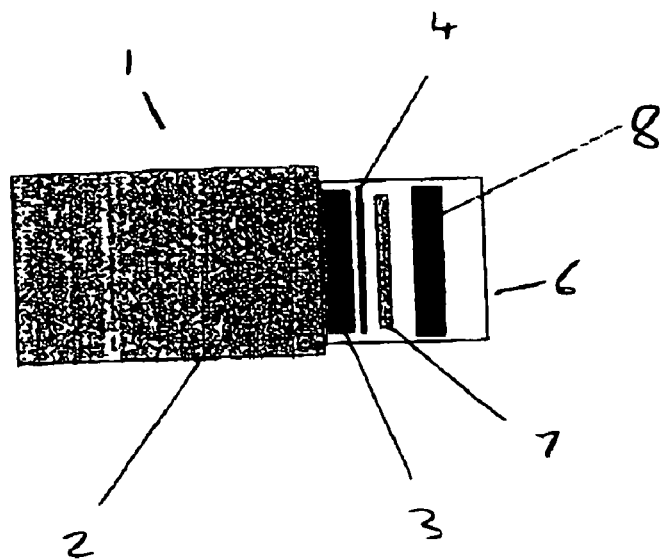
FIG. 1 is a schematic diagram of a camera according to the present invention.

Turning now to the drawings, FIG. 1 shows a schematic view of a camera 1 according to the present invention. The camera 1 has a housing 2 which contains a charge coupled device (CCD) 3 having a phosphor coating 4 attached thereto by a binder 5 (see FIG. 2). The camera housing 2 has an aperture 6 which receives light from an object to be viewed (not shown). The light then passes through one or more filters 7 and 8 which filter out unwanted incident light before it reaches the phosphor 4.

In this example, the phosphor is $Y_2O_2S{:}ErYb$ and is particulate, having a particle size range in the range of 5 μm to 9 μm and a density of 4.1 g/cm³. This is an anti-stokes phosphor which has emission peaks which are excitation dependent, but which can either be in the visible range or at approximately 985 nm. The latter peak is a more dominant photon process that is of significantly higher efficiency, yet it still maintains a fast enough response time to complement that of the camera and provide a lag free image.

Figure 2:
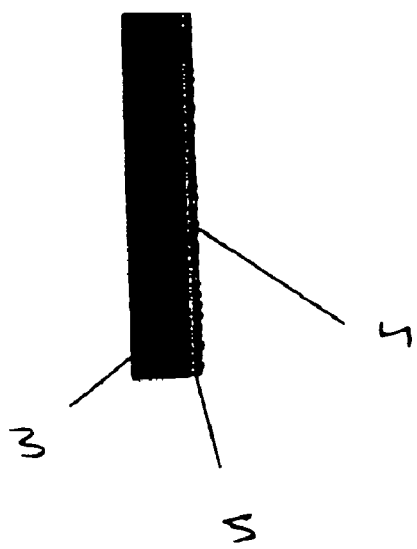
FIG. 2 is a schematic side view of a charge-coupled device (CCD) employed in the camera of FIG. 1.
Figure 3:
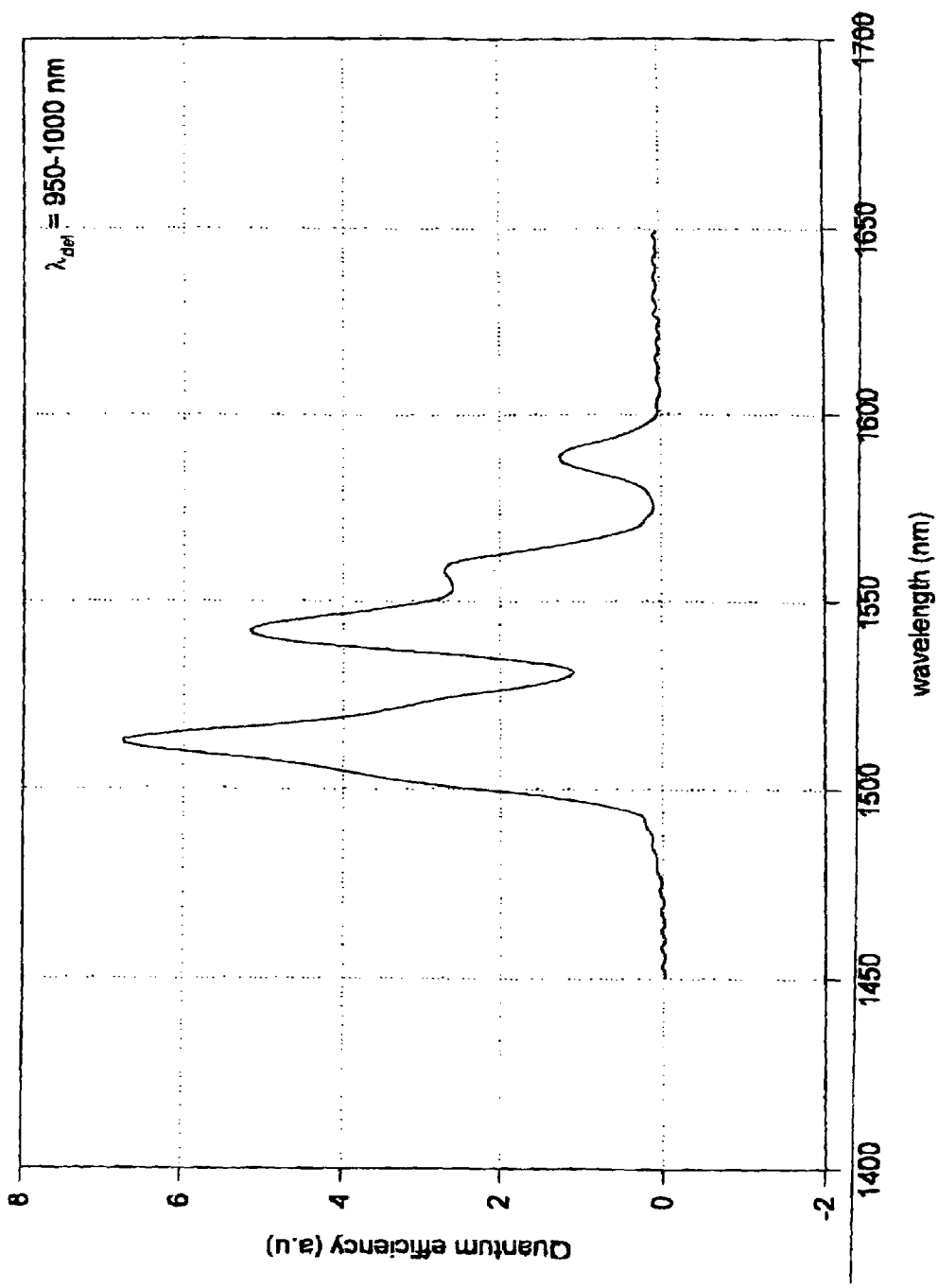
FIG. 3 is a graph showing the spectral response of an example camera according to the present invention.

FIG. 3 is a graph showing the spectral response from the exemplary camera of FIGS. 1 and 2 using a system with a resolution of 4 nm. This is based upon the provision of a CCD sensitive to emissions from the phosphor in the range of 950 nm to 1075 nm. it can be seen that, although there is not a flat spectral response in the operating range of the camera, this is not important for imaging purposes. The level of detection is influenced by the non-linear response of the phosphor with respect to incident illumination. However, this response of the phosphor with respect to incident illumination has the benefit of emphasizing brighter regions of the image. The sensitivity of the camera can be as low as 2 µJ/cm$^2$. The phosphor camera cannot be readily used as a measure of incident power or as a discriminator between adjacent laser wavelengths due to the non-uniform spectral response. The camera therefore can provide a good level of light detection in the general range of 1500 nm to 1610 nm, the operating range of many telecommunications devices such as optical fiber and free space optical communication networks as well as medical and biological imaging applications.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A camera comprising:
   a charge-coupled device (CCD), the CCD having an anti-stokes phosphor bound to the light receiving surface thereof, wherein the phosphor emits in the range of 950 nm to 1075 nm; and
   a housing surrounding the CCD and defining an aperture through which, in use, light can pass and be received by the phosphor.

2. A camera according to claim 1, wherein the anti-stokes phosphor is sensitive to light in the wavelength range of 1500 nm to 1610 nm.

3. A camera according to claim 1, comprising at least one filter positioned between the aperture and the phosphor on the CCD.

4. A camera according to claim 1, wherein the phosphor comprises ErYb in a host phosphor matrix.

5. A camera according to claim 4, wherein the host phosphor matrix comprises one of $Y_2O_2S$, $YF_3$, $NaYF_4$ and $La_2O_2S$.

6. A camera according to claim 1, wherein the phosphor is bound to the CCD by an adhesive.

7. A camera comprising:
   a charge-coupled device (CCD), the CCD having an anti-stokes phosphor directly bound to the light receiving surface thereof, wherein the phosphor emits in the range of 950 nm to 1075 nm; and
   a housing surrounding the CCD and defining an aperture through which, in use, light can pass and be received by the phosphor.

* * * * *